US006914922B2

(12) United States Patent
Hayashi et al.

(10) Patent No.: US 6,914,922 B2
(45) Date of Patent: Jul. 5, 2005

(54) NITRIDE BASED SEMICONDUCTOR LIGHT EMITTING DEVICE AND NITRIDE BASED SEMICONDUCTOR LASER DEVICE

(75) Inventors: Nobuhiko Hayashi, Osaka (JP); Takenori Goto, Ogaki (JP); Takashi Kano, Hirakata (JP); Yasuhiko Nomura, Moriguchi (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 0 days.

(21) Appl. No.: 09/898,043

(22) Filed: Jul. 5, 2001

(65) Prior Publication Data

US 2002/0003234 A1 Jan. 10, 2002

(30) Foreign Application Priority Data

Jul. 10, 2000 (JP) ........................................ 2000-208302

(51) Int. Cl.[7] ............................ H01S 5/00; H01L 33/00; H01L 29/06
(52) U.S. Cl. ............................ 372/45; 372/43; 372/44; 372/46; 257/79; 257/103
(58) Field of Search .............................. 372/43–50, 75; 279/79–103; 257/79–103

(56) References Cited

U.S. PATENT DOCUMENTS

| 4,961,197 | A | * | 10/1990 | Tanaka et al. ................. 372/45 |
| 5,578,839 | A | | 11/1996 | Nakamura et al. |
| 5,777,350 | A | | 7/1998 | Nakamura et al. |
| 5,812,576 | A | * | 9/1998 | Bour ............................. 372/45 |
| 5,886,367 | A | * | 3/1999 | Udagawa ...................... 257/64 |
| 5,974,069 | A | * | 10/1999 | Tanaka et al. ................. 372/46 |
| 6,069,394 | A | * | 8/2000 | Jenkner et al. ............... 257/466 |
| 6,172,382 | B1 | * | 1/2001 | Nagahama et al. ........... 257/94 |
| 6,177,359 | B1 | * | 1/2001 | Chen et al. ................... 438/751 |
| 6,252,894 | B1 | | 6/2001 | Sasanuma et al. |
| 6,266,355 | B1 | * | 6/2001 | Sverdlov ...................... 372/45 |
| 6,377,597 | B1 | * | 4/2002 | Okumura ..................... 372/45 |

FOREIGN PATENT DOCUMENTS

| JP | 11-251685 | | 9/1999 | |
| WO | WO98/39827 | * | 9/1998 | ............. H01S/3/18 |

OTHER PUBLICATIONS

M. Levinshteyn et al, "Properties of Advanced Semiconductor Materials: GaN, AlN, InN, BN, SiC, SiGe", John Wiley & Sons (New York 2001; ISBN 0–471–35827–4), particularly pp. 16, 39 and 58.*

(Continued)

*Primary Examiner*—Nathan J. Flynn
*Assistant Examiner*—Johannes Mondt
(74) *Attorney, Agent, or Firm*—Westerman, Hattori, Daniels & Adrian, LLP

(57) ABSTRACT

A semiconductor laser device is constructed by stacking a buffer layer, an undoped GaN layer, an n-GaN contact layer, an n-InGaN crack preventing layer, an n-AlGaN cladding layer, a light emitting layer, a p-AlGaN cladding layer, and a p-GaN contact layer in this order. A ridge portion comprising the p-GaN contact layer and the p-AlGaN cladding layer is formed, and the thickness of the p-AlGaN cladding layer in the ridge portion is less than 0.3 μm.

11 Claims, 5 Drawing Sheets

OTHER PUBLICATIONS

S. Nakamura et al, "The Blue Laser Diode—The Complete Story", Springer Verlag (Berlin, Heidelberg, New York), Second Revised and Enlarged Edition (2000), ISBN: 3-540-66505-6; in particular pp. 161-162.*

S. Nakamura, "Introduction to Nitride Semiconductor Blue Lasers and Light Emitting Diodes", Publ.: Taylor and Francis (New York, 2000, ISBN: 0-7484-0836-3), in particular: p. 357.*

Peng, T., and Piprek, J., "Refractive Index of AIGaInN Alloys", Electronics Letters, $21^{st}$ Nov. 1996, vol. 32, Issue 24.*

Steigerwald, D., et al, "III–V Nitride Semiconductors for High–Performance Blue and Green Light–Emitting Devices", JOM, vol. 49, Issue 9, pp. 18–23 (1997).*

Jpn. J. Appl. Phys., vol. 38, Part 2, No. 2B (1999), pp. L184–L186.

The Notice of Reasons for Refusal in the Counter part Japanese Application (JP2001–204810) and its translation thereof.

* cited by examiner

NITRIDE BASED SEMICONDUCTOR LIGHT EMITTING DEVICE AND NITRIDE BASED SEMICONDUCTOR LASER DEVICE

BACKGROUND OF THE INVENTION

1. Field of the Invention

The present invention relates to a semiconductor light emitting device composed of a Group III-V nitride based semiconductor (hereinafter referred to as a nitride based semiconductor) such as BN (boron nitride), GaN (gallium nitride), AlN (aluminum nitride), InN (indium nitride) or TlN (thallium nitride) or their mixed crystal.

2. Description of the Background Art

In recent years, nitride based semiconductor laser devices emitting blue or violet light have been investigated and developed as light sources for recording or reproduction used for high-density and large-capacity optical disk systems.

FIG. 8 is a schematic cross-sectional view showing an example of a conventional nitride based semiconductor laser device.

The semiconductor laser device shown in FIG. 8 is constructed by forming, on the C(0001) plane of a sapphire substrate 81, a buffer layer 82 composed of undoped AlGaN, an undoped GaN layer 83, an n-GaN contact layer 84 composed of n-GaN, a crack preventing layer 85 composed of n-InGaN, an n-AlGaN cladding layer 86 composed of n-AlGaN, a light emitting layer 87 composed of InGaN, a p-AlGaN cladding layer 91 composed of p-AlGaN, and a p-GaN contact layer 92 composed of p-GaN in this order by MOCVD (Metal Organic Chemical Vapor Deposition).

The light emitting layer 87 is constructed by stacking an n-GaN optical guide layer 88 composed of n-GaN, an MQW active layer 89 composed of InGaN and having a multi-quantum well (MQW) structure, and a p-GaN optical guide layer 90 composed of p-GaN in this order.

A portion to a predetermined depth of the p-AlGaN cladding layer 91 from the p-GaN contact layer 92 is etched away. Consequently, a striped ridge portion 93 comprising the p-GaN contact layer 92 and the p-AlGaN cladding layer 91 is formed, and a flat portion is formed in the p-AlGaN cladding layer 91. A p electrode 131 is formed on the p-GaN contact layer 92 in the ridge portion 93. Further, a partial region from the flat portion of the p-AlGaN cladding layer 91 to the n-GaN contact layer 84 is etched away, so that an n electrode forming region 94 in the n-GaN contact layer 84 is exposed. An n electrode 132 is formed on the exposed n electrode forming region 94.

An insulating film 95 composed of an Si oxide such as $SiO_2$ is formed on both side surfaces of the ridge portion 93, an upper surface of the flat portion of the p-AlGaN cladding layer 91, a side surface from the p-AlGaN cladding layer 91 to the n-GaN contact layer 84, and an upper surface of the n-GaN contact layer 84, excluding a region where the n electrode 132 is formed.

In the semiconductor laser device shown in FIG. 8, the difference in the refractive index between the light emitting layer 87 and the n-AlGaN cladding layer 86 and the p-AlGaN cladding layer 91 is small, i.e., approximately one-forth to one-third that in the conventional AlGaAs based semiconductor laser device, for example. Therefore, light generated in the MQW active layer 89 in the light emitting layer 87 is not easily waveguided to the light emitting layer 87.

Furthermore, the semiconductor laser device has a so-called anti-waveguided structure in which the refractive indexes of the n-GaN contact layer 84 and the p-GaN contact layer 92 respectively positioned outside the n-AlGaN cladding layer 86 and the p-AlGaN cladding layer 91 for confining light generated in the MQW active layer 89 in the light emitting layer 87 are higher than those of the n-AlGaN cladding layer 86 and the p-AlGaN cladding layer 91. Accordingly, a fundamental vertical transverse mode is not easily obtained.

A contact layer composed of a material having a high absorption coefficient, for example, GaAs can absorb light which has spread out of the cladding layers. However, the p-GaN contact layer 92 composed of GaN, as described above, cannot absorb light which has spread out of the p-AlGaN cladding layer 91 because it has a low absorption coefficient.

In the semiconductor laser device shown in FIG. 8, therefore, it is difficult to sufficiently confine light in the light emitting layer 87, so that the vertical transverse mode is easy to be a high-order mode. Therefore, it is difficult to reduce a threshold current in the semiconductor laser device.

In order to prevent the vertical transverse mode from being the high-order mode, the Al composition ratios of the n-AlGaN cladding layer 86 and the p-AlGaN cladding layer 91 are increased (made larger than 0.07, for example; $Al_xGa_{1-x}N$, x>0.07 when expressed by a general formula) or Al is added at a composition ratio of several percent to the n-GaN contact layer 84 (Al is added at a composition ratio of approximately 0.02, for example; $Al_{0.02}Ga_{0.98}N$). Consequently, a fundamental transverse mode is easily obtained. However, the Al composition ratios are thus increased, so that a growth layer is easily cracked. As a result, the yield of the device is greatly lowered.

The MQW active layer 89 in the semiconductor laser device is composed of InGaN having a higher lattice constant than those of GaN and AlGaN. The crystallinity of the MQW active layer 89 composed of InGaN is degraded if the thickness thereof is increased. In order not to degrade the crystallinity of the MQW active layer 89, therefore, the thickness of the MQW active layer 9 is decreased to several tens of angstroms. When the thickness of the MQW active layer 89 is thus decreased, however, light is not easily confined in the light emitting layer 87, and the vertical transverse mode is further easy to be a high-order mode. Therefore, it is more difficult to reduce the threshold current in the semiconductor laser device.

On the other hand, the p-AlGaN cladding layer 91 composed of p-AlGaN is high in resistance. Accordingly, in the semiconductor laser device, a series resistance between electrodes is increased. Therefore, it is difficult to reduce an operating voltage in the semiconductor laser device. Particularly when the semiconductor laser device is operated at a low temperature of not more than 0° C., the resistance of the p-AlGaN cladding layer 91 is further increased. Accordingly, the operating voltage is further increased. Consequently, a device breakdown such as a dielectric breakdown easily occurs.

SUMMARY OF THE INVENTION

An object of the present invention is to provide a nitride based semiconductor light emitting device in which a threshold current can be reduced by effectively confining light in a light emitting layer without decreasing the yield due to cracking.

Another object of the present invention is to provide a nitride based semiconductor light emitting device in which an operating voltage can be reduced without decreasing the yield due to cracking.

A nitride based semiconductor light emitting device according to an aspect of the present invention comprises a light emitting layer composed of a Group III nitride based semiconductor and including an active layer; and a cladding layer of a first conduction type composed of a Group III nitride based semiconductor, formed on the light emitting layer, having a larger band gap than the active layer, and having a lower refractive index than the active layer, the thickness of the cladding layer of a first conduction type being less than 0.3 μm.

In the nitride based semiconductor light emitting device, the thickness of the cladding layer of a first conduction type is kept as small as less than 0.3 μm. Therefore, light generated in the active layer is prevented from spreading out into the cladding layer of a first conduction type, thereby making it possible to cut off a high-order mode in a vertical transverse mode. Therefore, a threshold current can be reduced in the nitride based semiconductor light emitting device, and focusing characteristics for the laser beam are improved.

Particularly in the nitride based semiconductor light emitting device, even when the thickness of the active layer is decreased, light can be prevented from spreading out into the cladding layer of a first conduction type. In the nitride based semiconductor light emitting device, therefore, the thickness of the active layer can be decreased. In the nitride based semiconductor light emitting device in which the thickness of the active layer is small, good crystallinity can be realized for the active layer. In the nitride based semiconductor light emitting device, therefore, device characteristics can be improved.

Furthermore, in the nitride based semiconductor light emitting device, the thickness of the cladding layer of a first conduction type having a high resistance is as small as less than 0.3 μm. Accordingly, a series resistance between electrodes can be reduced. In the nitride based semiconductor light emitting device, therefore, an operating voltage in the device can be reduced.

The cladding layer of a first conduction type may have an aluminum composition ratio of not more than 0.05. The aluminum composition ratio of the cladding layer is thus set to not more than 0.05, thereby making it possible to reduce a strain induced in the nitride based semiconductor layer at the time of growing the nitride based semiconductor layer and to prevent the nitride based semiconductor layer from being cracked. Consequently, it is possible to reduce the operating voltage in the nitride based semiconductor light emitting device without reducing the yield of the device.

The light emitting layer may further include an optical guide layer of a first conduction type formed on the active layer, and the optical guide layer of a first conduction type may have a smaller band gap and a higher refractive index than the cladding layer of a first conduction type and have a larger band gap and a lower refractive index than the active layer, and the cladding layer of a first conduction type may be formed on the optical guide layer of a first conduction type.

Also in the nitride based semiconductor light emitting device, it is possible to effectively confine light into the active layer to reduce the threshold current as well as to reduce the resistance of the cladding layer of a first conduction type to reduce the operating voltage in the nitride based semiconductor light emitting device.

The light emitting layer may further include a carrier leakage preventing layer of a first conduction type formed on the active layer and having a larger band gap than the optical guide layer of a first conduction type, and the optical guide layer of a first conduction type may be formed on the carrier leakage preventing layer of a first conduction type.

In this case, the carrier leakage preventing layer makes it possible to prevent carriers from leaking from the active layer to the optical guide layer of a first conduction type. In the nitride based semiconductor light emitting device, therefore, the threshold current can be further reduced.

The cladding layer of a first conduction type may have a ridged portion, and the thickness of the ridge portion may be less than 0.3 μm.

In this case, a nitride based semiconductor light emitting device having a ridge guided structure which can be decreased in the threshold current and the operating voltage is obtained.

The Group III nitride based semiconductor may contain at least one of boron, gallium, aluminum, indium, and thallium.

The cladding layer of a first conduction type may contain gallium and aluminum. The active layer may contain gallium and indium.

The active layer may have a multi-quantum well structure alternately including one or more well layers and a plurality of quantum barrier layers, and the band gap of the active layer may be the band gap of the one or more well layers.

The electric field distribution of laser light in the active layer may be changed in accordance with a sine function or a cosine function, and the electric field distribution of laser light in the cladding layer of a first conduction type may be changed in accordance with an exponential function.

The nitride based semiconductor light emitting device may further comprise a current blocking layer formed on or in the cladding layer of a first conduction type and having a striped opening.

In this case, a nitride based semiconductor light emitting device having a self-aligned structure which can be decreased in the threshold current and the operating voltage is obtained.

The first conduction type may be a p type. When the p-type cladding layer is a cladding layer of a first conduction type, the p-type cladding layer is higher in resistance than an n-type cladding layer. Accordingly, the present invention is particularly effective in terms of reduction in the series resistance between electrodes. Therefore, the present invention is particularly effective in terms of reduction in the operating voltage in the nitride based semiconductor light emitting device.

The nitride based semiconductor light emitting device may further comprise a cladding layer of a second conduction type composed of a Group III nitride based semiconductor, and the light emitting layer may be formed on the cladding layer of a second conduction type.

A nitride based semiconductor light emitting device according to another aspect of the present invention comprises a light emitting layer composed of a Group III nitride based semiconductor and including an active layer and an optical guide layer of a first conduction type formed on the active layer; and an electrode which is brought into ohmic contact with the optical guide layer of a first conduction type, the optical guide layer of a first conduction type having a larger band gap than the active layer and having a lower refractive index than the active layer.

In the nitride based semiconductor light emitting device, the electrode is brought into ohmic contact with the optical guide layer of a first conduction type constituting the light emitting layer. In the nitride based semiconductor light emitting device, it is possible to effectively confine light generated in the active layer into the active layer and to cut off the high-order mode in the vertical transverse mode. Consequently, it is possible to reduce the threshold current in the nitride based semiconductor light emitting device and to improve focusing characteristics for the laser beam.

Particularly in the nitride based semiconductor light emitting device, even when the thickness of the active layer is decreased, light can be effectively confined into the active layer. In the nitride based semiconductor light emitting device, therefore, the thickness of the active layer can be reduced. In the nitride based semiconductor light emitting device in which the thickness of the active layer is small, it is possible to realize good crystallinity in the active layer. Accordingly, it is possible to improve the device characteristics in the nitride based semiconductor light emitting device.

Furthermore, in the nitride based semiconductor light emitting device, the cladding layer of a first conduction type having a high resistance is not formed, thereby reducing the series resistance between the electrodes. In the nitride based semiconductor light emitting device, therefore, the operating voltage of the device can be reduced.

Particularly in this case, it is possible to prevent the variation in the operating voltage which is caused by the change in the operating temperature of the device. When the device is operated under low temperatures, therefore, it is possible to prevent the occurrence of a device breakdown such as a dielectric breakdown.

The light emitting layer may further include a carrier leakage preventing layer of a first conduction type formed on the active layer and having a larger band gap than the optical guide layer of a first conduction type, and the optical guide layer of a first conduction type may be formed on the carrier leakage preventing layer of a first conduction type.

In this case, the carrier leakage preventing layer makes it possible to prevent carriers from leaking from the active layer to the optical guide layer of a first conduction type. In the nitride based semiconductor light emitting device, therefore, the threshold current can be further reduced.

The optical guide layer of a first conduction type may be a ridged portion, and the electrode may be brought into ohmic contact with an upper surface of the ridged portion.

In this case, a nitride based semiconductor light emitting device having a ridge guided structure which can be decreased in the threshold current and the operating voltage is realized.

The Group III nitride based semiconductor may contain at least one of boron, gallium, aluminum, indium, and thallium.

The active layer may contain gallium and indium, and the optical guide layer of a first conduction type may contain gallium.

The active layer may have a multi-quantum well structure alternately including one or more well layers and a plurality of quantum barrier layers, and the band gap of the active layer may be the band gap of the one or more well layers.

The electric field distributions of laser light in the active layer and the optical guide layer of a first conduction type may be changed in accordance with a sine function or a cosine function.

The active layer may contain gallium and indium, the optical guide layer of a first conduction type may contain gallium, and the carrier leakage preventing layer of a first conduction type may contain gallium and aluminum.

The nitride based semiconductor light emitting device may further comprise a current blocking layer formed on the light emitting layer and having a striped opening.

In this case, a nitride based semiconductor light emitting device having a self-aligned structure which can be decreased in the threshold current and the operating voltage is obtained.

The first conduction type may be a p type. When the optical guide layer of a first conduction type is a p-type optical guide layer, the p-type cladding layer having a higher resistance than an n-type cladding layer is not formed. Therefore, the present invention is particularly effective in terms of reduction in the operating voltage in the nitride based semiconductor light emitting device.

The nitride based semiconductor light emitting device further comprises a cladding layer of a second conduction type composed of a Group III nitride based semiconductor, and the light emitting layer may be formed on the cladding layer of a second conduction type.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A semiconductor laser device will be described as a semiconductor light emitting device according to the present invention.

Figure 1:
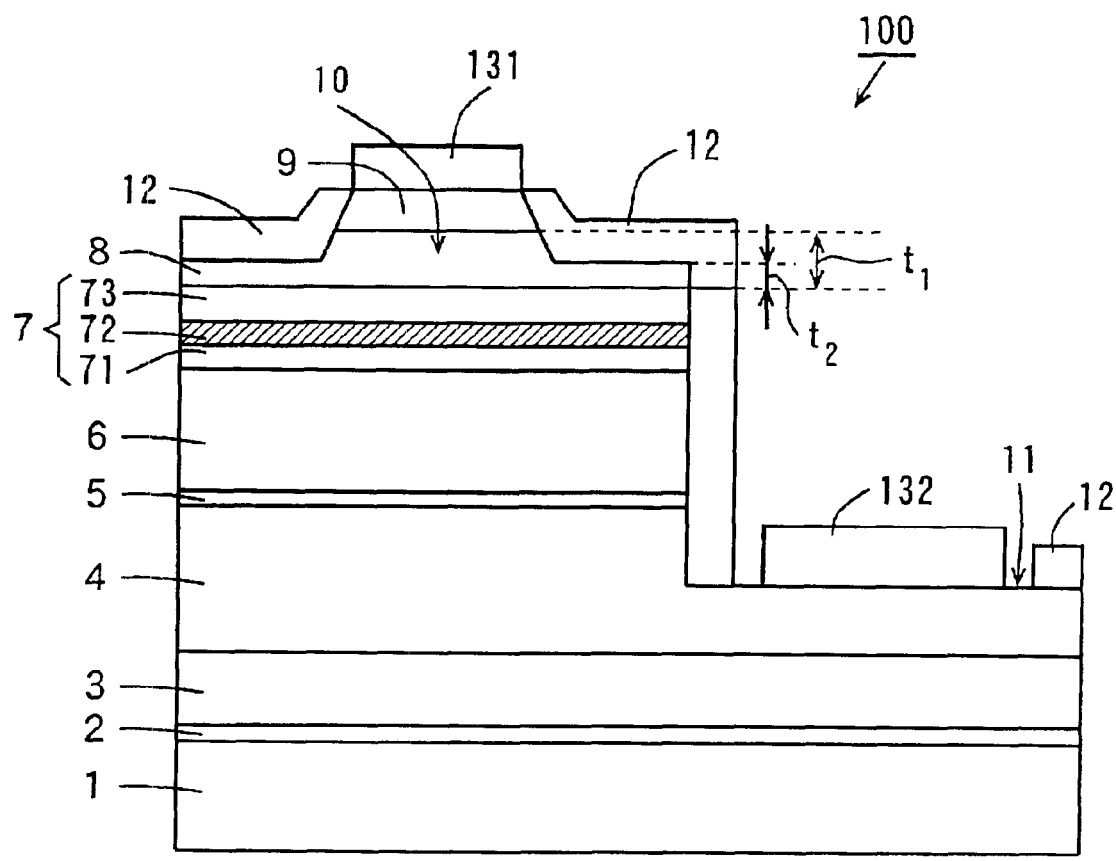
FIG. 1 is a schematic cross-sectional view showing a semiconductor laser device in an embodiment of the present invention.

FIG. 1 is a schematic cross-sectional view showing a semiconductor laser device in an embodiment of the present invention.

The semiconductor laser device 100 shown in FIG. 1 is constructed by forming, on the C(0001) plane of a sapphire substrate 1, a buffer layer 2 composed of undoped $Al_{0.5}Ga_{0.5}N$ and having a thickness of 250 Å, an undoped GaN layer 3 having a thickness of 2 µm, an n-GaN contact layer 4 composed of Si doped GaN and having a thickness of 3 µm, an n-InGaN crack preventing layer 5 composed of Si doped $In_{0.1}Ga_{0.9}N$ and having a thickness of 0.1 µm, an n-AlGaN cladding layer 6 composed of Si doped $Al_{0.05}Ga_{0.95}N$ and having a thickness of 1 µm, a light emitting layer 7, a p-AlGaN cladding layer 8 composed of Mg doped $Al_{0.05}Ga_{0.95}N$, and a p-GaN contact layer 9 composed of Mg doped GaN and having a thickness of 0.05 µm in this order. Each of the layers 2 to 9 is formed by MOCVD (Metal Organic Chemical Vapor Deposition), for example.

Figure 2:
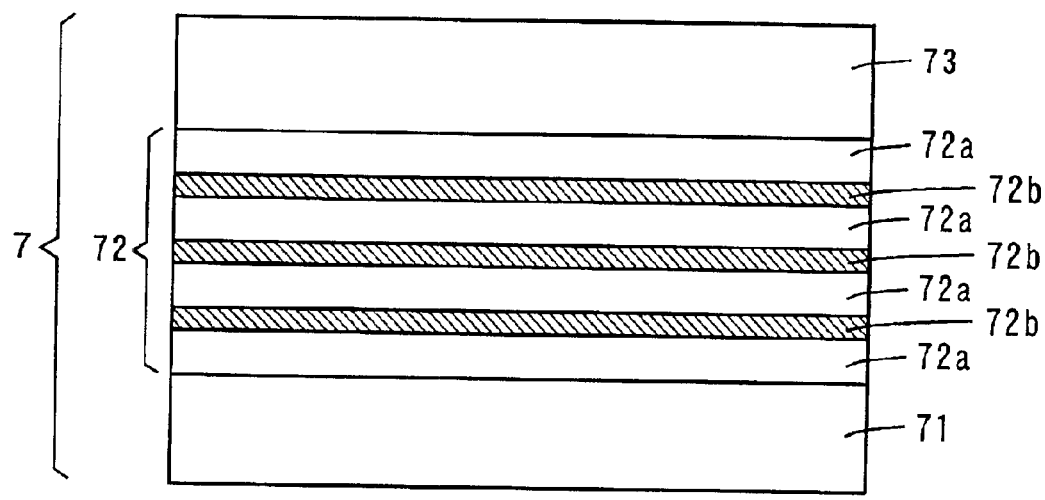
FIG. 2 is a schematic partially enlarged view showing the detailed structure of a light emitting layer in the semiconductor laser device shown in FIG. 1.

FIG. 2 is a schematic partially enlarged sectional view showing the detailed structure of the light emitting layer 7. As shown in FIG. 2, the light emitting layer 7 comprises an n-GaN optical guide layer 71 composed of Si doped GaN and having a thickness of 0.1 µm, an MQW active layer 72 having a multi-quantum well (MQW) structure, and a p-GaN optical guide layer 73 composed of Mg doped GaN and having a thickness of 0.1 µm. The MQW active layer 72 has a multi-quantum well structure obtained by alternately stacking four n-InGaN barrier layers 72a composed of Si doped $In_{0.02}Ga_{0.98}N$ and having a thickness of 90 nm and three n-InGaN well layers 72b composed of Si doped $In_{0.1}Ga_{0.9}N$ and having a thickness of 30 nm.

A layer having a smaller band gap and a higher refractive index than a cladding layer and having a larger band gap and a lower refractive index than the active layer is defined as an optical guide layer. When the active layer has a multi-quantum well structure, as in this example, the band gap of a well layer in the active layer is defined as the band gap of the active layer.

As shown in FIG. 1, a partial region from the p-GaN contact layer 9 to the p-AlGaN cladding layer 8 is etched by reactive ion etching (RIE) or reactive ion beam etching (RIBE). Consequently, a striped ridge portion 10 comprising the p-GaN contact layer 9 and the p-AlGaN cladding layer 8 is formed, and a flat portion is formed in the p-AlGaN cladding layer 8. The semiconductor laser device 100 in the present embodiment has a ridge guided structure.

A partial region from the flat portion of the p-AlGaN cladding layer 8 to the n-GaN contact layer 4 is etched by RIE or RIBE, so that an n electrode forming region 11 in the n-GaN contact layer 4 is exposed.

A p electrode 131 is formed on the p-GaN contact layer 9 in the ridge portion 10, and an n electrode 132 is formed on the n electrode forming region 11 in the n-GaN contact layer 4. Further, an insulating film 12 composed of $SiO_2$ or the like is formed on both side surfaces of the ridge portion 10, an upper surface of the flat portion of the p-AlGaN cladding layer 8, a side surface from the p-AlGaN cladding layer 8 to the n-GaN contact layer 4, and an upper surface of the n-GaN contact layer 4 excluding a region where the n electrode 132 is formed.

In the foregoing, the thickness $t_1$ of the p-AlGaN cladding layer 8 in the ridge portion 10 in the semiconductor laser device 100 is less than 0.3 µm. On the other hand, it is preferable that the thickness $t_2$ of the flat portion of the p-AlGaN cladding layer 8 positioned on both sides of the ridge portion 10 is 0.05 to 0.15 µm from the point of view of transverse mode control of the semiconductor laser device 100. In this case, $t_1$ and $t_2$ satisfy a relationship of $t_1 > t_2$.

In this case, the thickness $t_1$ of the ridge portion 10 is defined as the thickness of the p-AlGaN cladding layer 8. In the semiconductor laser device 100 in which the thickness $t_1$ of the p-AlGaN cladding layer 8 is set to less than 0.3 µm, the following effect is obtained.

Figure 3:
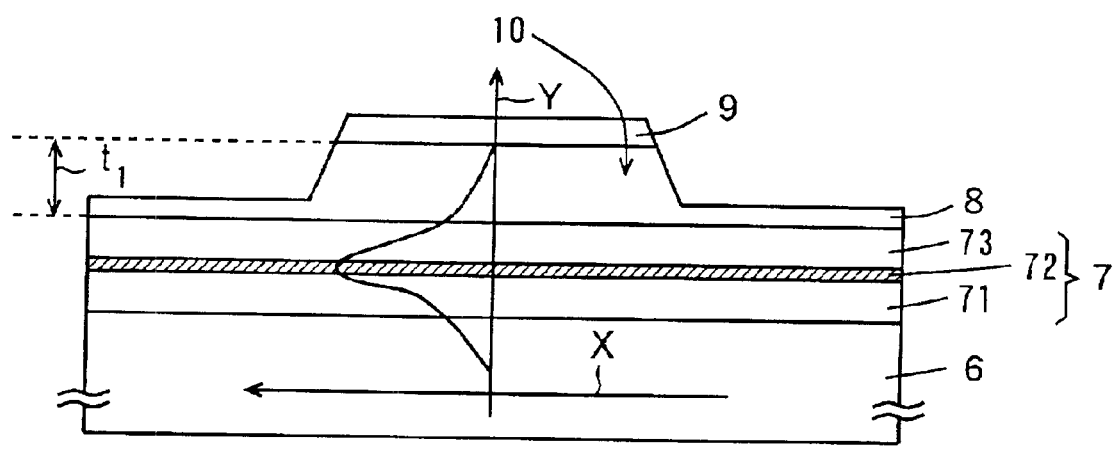
FIG. 3 is a schematic cross-sectional view showing the electric field distribution of laser light in a predetermined region of the semiconductor laser device shown in FIG. 1.

FIG. 3 is a schematic cross-sectional view showing the electric field distribution of laser light in a predetermined region of the semiconductor laser device shown in FIG. 1. In FIG. 3, the illustration of the insulating film 12 and the p electrode 131 is omitted. The strength of an electric field is used to enter the X-axis, and the Y-axis is a spatial axis in a direction perpendicular to each of the layers 6 to 9 in the semiconductor laser device 100.

FIG. 3 illustrates the electric field distribution of laser light in a predetermined region of the n-AlGaN cladding layer 6, the light emitting layer 7, the p-AlGaN cladding layer 8, and the p-GaN contact layer 9. Here, the electric field distribution of laser light in a region other than the regions is not illustrated. In this case, the electric field distribution in each of the AlGaN cladding layers 6 and 8 is represented by an exponential function (exp.). On the other hand, the electric field distribution in the MQW active layer 72 and the GaN optical guide layers 71 and 73 in the light emitting layer 7, the GaN optical guide layers 71 and 73, and the p-GaN contact layer 9 is represented by a sine function and a cosine function (sin and cos).

As shown in FIG. 3, in the semiconductor laser device 100 comprising the p-AlGaN cladding layer 8 having a thickness $t_1$ of less than 0.3 µm, light hardly spreads out of the light emitting layer 7 into the p-AlGaN cladding layer 8, so that light is effectively confined in the light emitting layer 7. Therefore, the vertical transverse mode is a lowest-order fundamental mode. In the semiconductor laser device 100, the threshold current is reduced, and focusing characteristics for the laser beam are improved.

For comparison, description is made of a case where the thickness $t_1$ of the p-AlGaN cladding layer 8 is set to not less than 0.3 µm.

Figure 4:
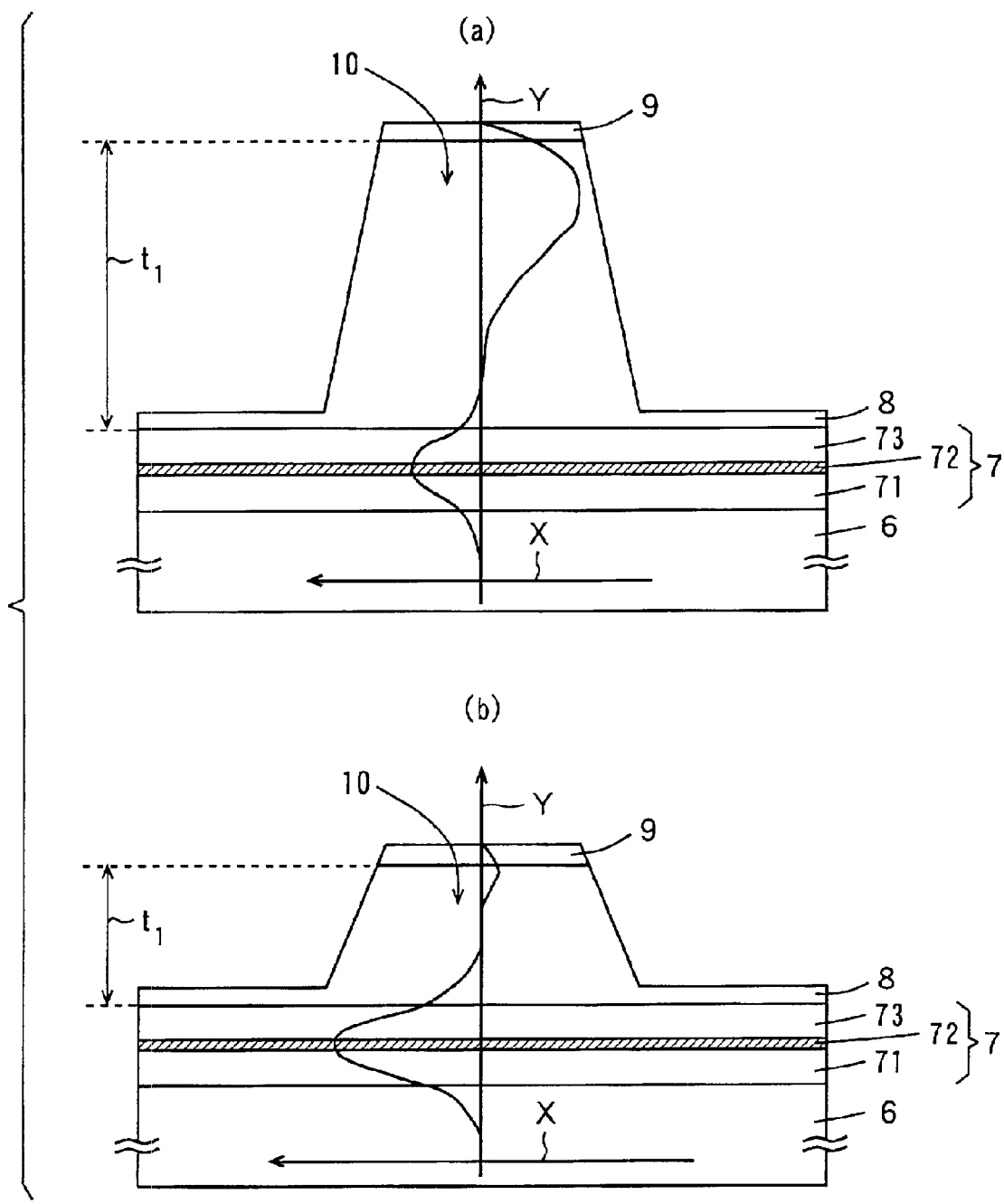
FIG. 4 is a schematic cross-sectional view showing the electric field distribution of laser light in a semiconductor laser device in which the thickness of a p-AlGaN cladding layer is not less than 0.3 $\mu$m.

FIG. 4 illustrates the electric field distribution of laser light in a semiconductor laser device having the same structure as the semiconductor laser device 100 shown in FIG. 1 and comprising the p-AlGaN cladding layer 8 having a thickness $t_1$ of not less than 0.3 µm. FIG. 4(a) illustrates a case where the thickness $t_1$ of the p-AlGaN cladding layer 8 is more than 0.6 µm, and FIG. 4(b) illustrates a case where the thickness $t_1$ of the p-AlGaN cladding layer 8 is approximately 0.3 to 0.6 µm.

FIG. 4 is a schematic view where the strength of an electric field is used to enter the X-axis, and the Y-axis is a spatial axis in a direction perpendicular to each of the layers 6 to 9 in the semiconductor laser device, similarly to FIG. 3.

In FIG. 4, the illustration of the detailed structure of the semiconductor laser device is omitted, as in FIG. 3, and the electric field distribution of laser light in a predetermined region of the n-AlGaN cladding layer 6, and a region other than the light emitting layer 7, the p-AlGaN cladding layer 8, and the p-GaN contact layer 9 is not illustrated.

As shown in FIG. 4(a), when the thickness $t_1$ of the p-AlGaN cladding layer 8 is more than 0.6 µm, a large electric field exists in the p-AlGaN cladding layer 8. That is, light greatly spreads out of the light emitting layer 7 into the p-AlGaN cladding layer 8, so that light is not sufficiently confined in the light emitting layer 7. In such a state, the vertical transverse mode is a high-order mode, that is, a primary mode in this case. In the semiconductor laser device, therefore, it is very difficult to reduce a threshold current. Further, focusing characteristics for the laser beam are not good.

On the other hand, as shown in FIG. 4(b), when the thickness $t_1$ of the p-AlGaN cladding layer 8 is approximately 0.3 to 0.6 μm, an electric field slightly exists in the vicinity of the interface between the p-AlGaN cladding layer 8 and the p-GaN contact layer 9. That is, in this case, the amount of light spreading out of the light emitting layer 7 into the p-AlGaN cladding layer 8 is smaller, as compared with that in the case of FIG. 4(a) where the thickness $t_1$ of the p-AlGaN cladding layer 8 is more than 0.6 μm.

Also in this case, however, light cannot be sufficiently confined in the light emitting layer 7, so that the vertical transverse mode is a primary mode. Consequently, it is difficult to reduce the threshold current in the semiconductor laser device. Further, focusing characteristics for the laser beam are not good.

As described in the foregoing, on the side of the p-type semiconductor layer in the semiconductor laser device 100 in which the thickness $t_1$ of the p-AlGaN cladding layer 8 is as small as less than 0.3 μm, light is prevented from spreading out of the light emitting layer 7 into the p-AlGaN cladding layer 8, thereby cutting off the high-order mode in the vertical transverse mode. In the semiconductor laser device 100, therefore, it is possible to reduce the threshold current. In this case, focusing characteristics for the laser beam are good.

In the semiconductor laser device 100, even when the thickness of the MQW active layer 72 is decreased, light can be prevented from spreading out into the p-type semiconductor layer. In the semiconductor laser device 100, therefore, the thickness of the MQW active layer 72 can be decreased. In the MQW active layer 72 having a small thickness, good crystallinity is realized. In the semiconductor laser device 100, therefore, device characteristics are improved.

In the semiconductor laser device 100, it is possible to sufficiently prevent carriers from leaking out of the MQW active layer 72 by the p-AlGaN cladding layer 8. Consequently, the threshold current is further reduced.

Furthermore, in the semiconductor laser device 100, the thickness $t_1$ of the p-AlGaN cladding layer 8 having a high resistance is as small as less than 0.3 μm, thereby making it possible to reduce a series resistance between the p electrode 131 and the n electrode 132. In the semiconductor laser device 100, therefore, an operating voltage is reduced.

Although in the semiconductor laser device 100, both the p-AlGaN cladding layer 8 and the n-AlGaN cladding layer 6 are composed of $Al_{0.05}Ga_{0.95}N$, the Al composition ratio may be more than 0.05. However, the Al composition ratio of the cladding layer is set to not more than 0.05, thereby making it possible to reduce a strain induced in the nitride based semiconductor layer at the time of growing the nitride based semiconductor layer and to prevent the nitride based semiconductor layer from being cracked. Consequently, it is possible to reduce the operating voltage in the nitride based semiconductor light emitting device without reducing the yield of the device.

Description is made of a case where in the semiconductor laser device 100, both the p-AlGaN cladding layer 8 and the n-AlGaN cladding layer 6 are composed of $Al_{0.05}Ga_{0.95}N$ and have the same band gaps, the p-AlGaN cladding layer 8 and the n-AlGaN cladding layer 6 may have different band gaps.

Although description was made of a case where both the n-GaN optical guide layer 71 and the p-GaN optical guide layer 73 are formed, either one of the n-GaN optical guide layer 71 and the p-GaN optical guide layer 73 may be formed, or neither the n-GaN optical guide layer 71 nor the p-GaN optical guide layer 73 may be formed.

Figure 5:
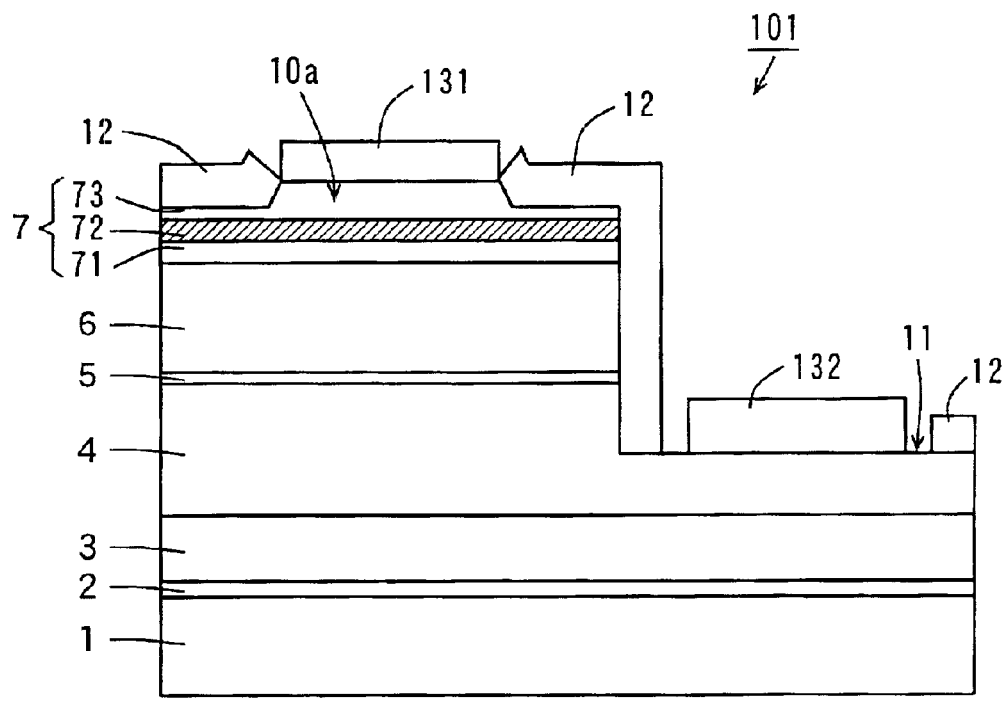
FIG. 5 is a schematic cross-sectional view showing a semiconductor laser device in another embodiment of the present invention.

FIG. 5 is a schematic cross-sectional view showing a semiconductor laser device in another embodiment of the present invention. The semiconductor laser device 101 shown in FIG. 5 has the same structure as the semiconductor laser device shown in FIG. 1 except for the following.

As shown in FIG. 5, in the semiconductor laser device 101, a predetermined region of a p-GaN optical guide layer 73 having a thickness of 0.1 μm constituting a light emitting layer 7 is etched to a predetermined depth, thereby forming a ridge portion 10a.

In this case, it is preferable that the thickness of a flat portion of the p-GaN optical guide layer 73 is not more than 0.05 μm from the point of view of transverse mode control of the semiconductor laser device 101. Further, the semiconductor laser device 101 may have a structure in which the predetermined region of the p-GaN optical guide layer 73 is etched until an MQW active layer 72 is exposed so that a ridged p-GaN optical guide layer 73 is formed on the MQW active layer 72.

In the semiconductor laser device 101, a p electrode 131 is formed on an upper surface of the ridge portion 10a of the p-GaN optical guide layer 73. Further, an insulating film 12 composed of $SiO_2$, etc. is formed on both side surfaces of a ridge portion 10a in a p-GaN optical guide layer 73, an upper surface of a flat portion of the p-GaN optical guide layer 73, a side surface from the p-GaN optical guide layer 73 to an n-GaN contact layer 4, and an upper surface of the n-GaN contact layer 4 excluding a region where an n electrode 132 is formed.

In the semiconductor laser device 101 according to the present embodiment, the p-AlGaN cladding layer and the p-GaN contact layer as in the semiconductor laser device 100 shown in FIG. 1 are not formed. Instead, the ridge portion 10a is formed in the p-GaN optical guide layer 73 so that an upper surface of the ridge portion 10a is brought into ohmic contact with the p electrode 131.

On the side of a p-type semiconductor layer in the semiconductor laser device 101, spreading of light generated in the MQW active layer 72 is limited to spreading into the p-GaN optical guide layer 73. Therefore, it is possible to prevent light from spreading to effectively confine light in the MQW active layer 72. Consequently, it is possible to sufficiently cut off a high-order mode in a vertical transverse mode. In the semiconductor laser device 101, therefore, a threshold current is reduced, and focusing characteristics for the laser beam are improved.

In the semiconductor laser device 101, even when the thickness of the MQW active layer 72 is decreased, it is possible to prevent light from spreading to effectively confine light in the MQW active layer 72. In the semiconductor laser device 101, therefore, the thickness of the MQW active layer 72 can be decreased. In the MQW active layer 72 having a small thickness, good crystallinity is realized. In the semiconductor laser device 101, therefore, device characteristics are improved.

Furthermore, in the semiconductor laser device 101, the p-AlGaN cladding layer having a high resistance is not formed, thereby sufficiently reducing an operating voltage.

Particularly in the semiconductor laser device 101, the variation in the operating voltage which is caused by the change in the operating temperature of the device can be kept small. That is, in the semiconductor laser device 101, even when the operating temperature is lowered, the operating voltage is hardly raised. Accordingly, it is possible to also prevent a device breakdown such as a dielectric breakdown from occurring under low temperatures.

Figure 6:
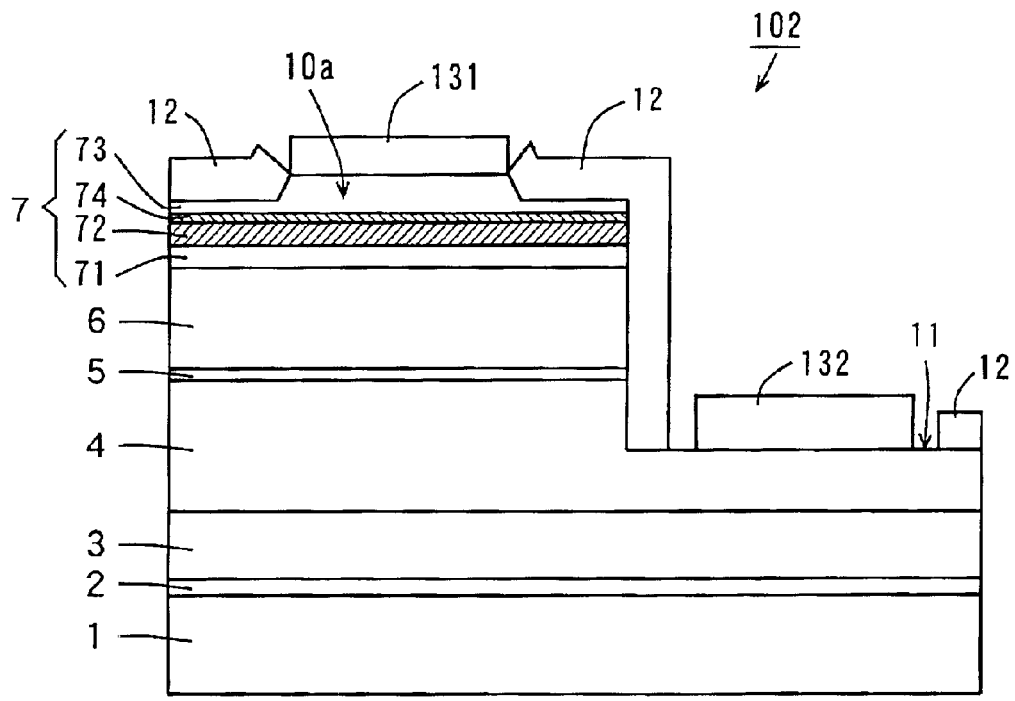
FIG. 6 is a schematic cross-sectional view showing a semiconductor laser device in still another embodiment of the present invention.

FIG. 6 is a schematic cross-sectional view showing a semiconductor laser device in still another embodiment of the present invention.

The semiconductor laser device 102 shown in FIG. 6 has the same structure as the semiconductor laser device 101 shown in FIG. 5 except that a carrier leakage preventing layer 74 is formed on an MQW active layer 72, and a p-GaN optical guide layer 73 is formed on the carrier leakage preventing layer 74.

The carrier leakage preventing layer 74 has a larger band gap than the MQW active layer 72 and the p-GaN optical guide layer 73. Here, the band gap of the n-InGaN well layer 72b is defined as the band gap of the MQW active layer 72, as described above.

For example, in the semiconductor laser device 102, the carrier leakage preventing layer 74 composed of p-$Al_{0.25}Ga_{0.75}N$ and having a thickness of 200 Å is formed. In the semiconductor laser device 102 in which the carrier leakage preventing layer 74 is formed, the carrier leakage preventing layer 74 serves as a barrier, thereby preventing carriers (electrons) from leaking from the MQW active layer 72 to the p-GaN optical guide layer 73.

On the side of the p-type semiconductor layer in the semiconductor laser device 102, spreading of light generated in the MQW active layer 72 is limited to spreading into the carrier leakage preventing layer 74 and the p-GaN optical guide layer 73. Therefore, it is possible to prevent light from spreading to effectively confine light in the MQW active layer 72. Consequently, it is possible to sufficiently cut off a high-order mode in a vertical transverse mode. In the semiconductor laser deice 102, therefore, a threshold current is reduced, and focusing characteristics for the laser beam are improved.

Particularly in this case, the carrier leakage preventing layer 74 is formed on the MQW active layer 72, thereby making it possible to prevent electrons (carriers) from leaking from the MQW active layer 72 to the p-GaN optical guide layer 73. In the semiconductor laser device 102, therefore, the threshold current is further reduced.

In the semiconductor laser device 102, even when the thickness of the MQW active layer 72 is decreased, it is possible to prevent light from spreading to effectively confine light in the MQW active layer 72. In the semiconductor laser device 102, therefore, the thickness of the MQW active layer 72 can be decreased. In the MQW active layer 72 having a small thickness, good crystallinity is realized. In the semiconductor laser device 102, therefore, device characteristics are improved.

Furthermore, in the semiconductor laser device 102, the p-AlGaN cladding layer having a high resistance is not formed, thereby sufficiently reducing an operating voltage.

Particularly in the semiconductor laser device 102, the variation in the operating voltage which is caused by the change in the operating temperature of the device can be kept small. That is, in the semiconductor laser device 102, even when the operating temperature is lowered, the operating voltage is hardly raised. Accordingly, it is possible to also prevent a device breakdown such as a dielectric breakdown from occurring under low temperatures.

Although description was made of a case where the carrier leakage preventing layer 74 is composed of p-AlGaN having a high resistance, the carrier leakage preventing layer 74 does not affect the operating voltage in the semiconductor laser device 102 because the thickness thereof is as small as 200 Å. In sufficiently preventing carriers from leaking to reduce the operating voltage of the device, it is preferable that the thickness of the carrier leakage preventing layer 74 is 150 to 300 Å.

In the semiconductor laser devices 100 to 102, the structure of each of the layers is not limited to the foregoing. Each of the layers may be composed of a nitride based semiconductor containing at least one of Al, Ga, In, B and Tl. Although in the foregoing, a sapphire substrate is used as the substrate, a substrate composed of Si, SiC, GaN, etc. may be used.

Furthermore, although description was made of a case where the n-type layers and the p-type layers are formed in this order on the substrate, the p-type layers and the n-type layers may be formed in this order on the substrate.

Although description was made of a case where the present invention is applied to the semiconductor laser device having a ridge guided structure, the present invention may be applied to a semiconductor laser device having a self-aligned structure. This case will be described later.

Figure 7:
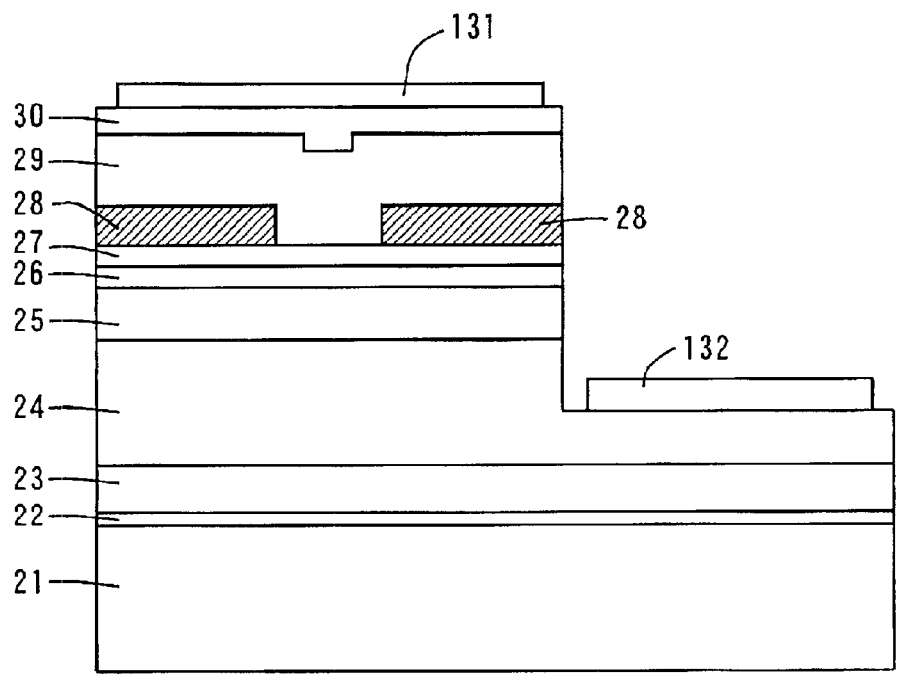
FIG. 7 is a schematic cross-sectional view showing a semiconductor laser device in a further embodiment of the present invention.
Figure 8:
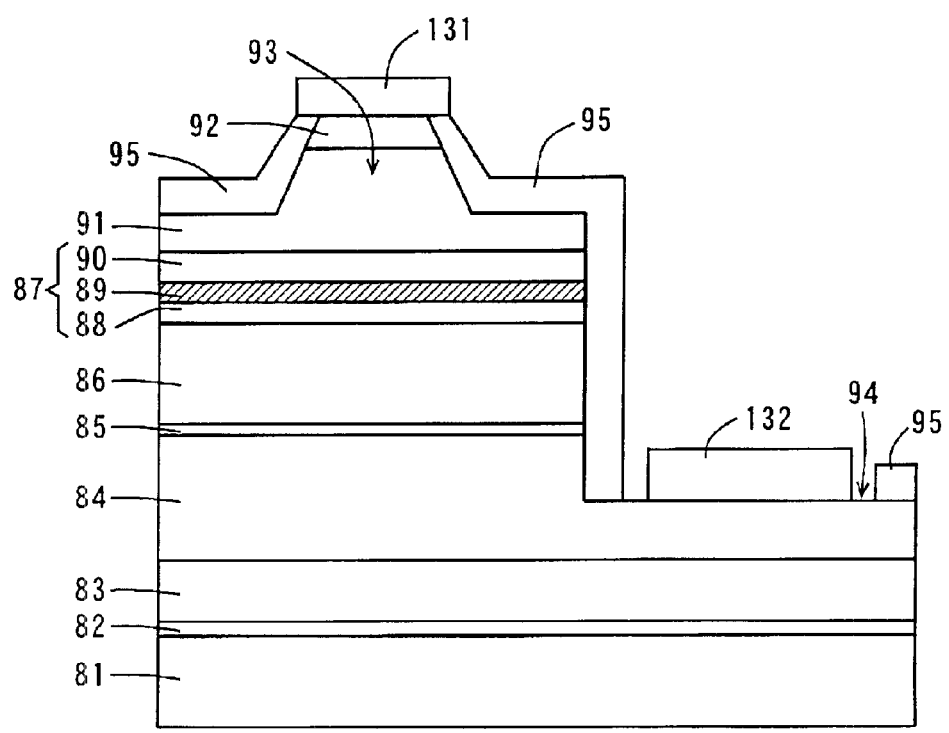
FIG. 8 is a schematic cross-sectional view showing an example of a conventional nitride based semiconductor laser device.

FIG. 7 is a schematic cross-sectional view showing a semiconductor laser device according to a further embodiment of the present invention. The semiconductor laser device shown in FIG. 7 is constructed by stacking, on the C(0001) plane of a sapphire substrate 21, a buffer layer 22 composed of undoped AlGaN, an undoped GaN layer 23, an n-GaN contact layer 24 composed of n-GaN, an n-AlGaN cladding layer 25 composed of n-$Al_{0.05}Ga_{0.95}N$, a light emitting layer 26, a p-AlGaN first cladding layer 27 composed of p-$Al_{0.05}Ga_{0.95}N$, an n-AlGaN current blocking layer 28 composed of n-AlGaN having an opening, a p-AlGaN second cladding layer 29 composed of p-$Al_{0.05}Ga_{0.95}N$, and a p-GaN contact layer 30 composed of p-GaN in this order. A partial region from the p-GaN contact layer 30 to the n-GaN contact layer 24 is removed, so that the n-GaN contact layer 24 is exposed. An n electrode 132 is formed on the exposed n-GaN contact layer 24. Further, a p electrode 131 is formed on a predetermined region of the p-GaN contact layer 30.

The structure of the light emitting layer 26 is the same as the structure of the light emitting layer 7 in the semiconductor laser device 100 shown in FIG. 1.

The semiconductor laser device thus has a self-aligned structure. In such a semiconductor laser device, the total thickness of the p-AlGaN first cladding layer 27 and the p-AlGaN second cladding layer 29 is set to less than 0.3 μm. Consequently, the same effect as that in the semiconductor laser device 100 shown in FIG. 1 is obtained.

The semiconductor laser device may be a semiconductor laser device having a self-aligned structure in which no p-type cladding layer is formed.

For example, the semiconductor laser device shown in FIG. 7 may have a structure in which the n-AlGaN current blocking layer 28 having an opening is directly formed on the light emitting layer 26, and the p-GaN contact layer 30 is formed on the n-AlGaN current blocking layer 28 and on the light emitting layer 26 exposed in the opening of the n-AlGaN current blocking layer 28. In this case, the same effect as that in the semiconductor laser device 101 shown in FIG. 5 is obtained. Further, in this case, a carrier leakage preventing layer may be formed between the MQW active layer and the p-GaN optical guide layer in the light emitting layer 26, as in the semiconductor laser device 102 shown in FIG. 6.

A semiconductor laser device in another embodiment of the present invention has the same structure as shown in FIG. 1 except that a p-type carrier leakage preventing layer is formed on the MQW active layer 72, and the p-GaN optical guide layer 73 is formed on the p-type carrier leakage preventing layer.

The carrier leakage preventing layer has a larger band gap than the MQW active layer 72 and the p-GaN optical guide layer 73. Here, the band gap of the n-InGaN well layer 72$b$ is defined as the band gap of the MQW active layer 72, as described above. For example, in the semiconductor laser device of this embodiment, the carrier leakage preventing layer composed of p-$Al_{0.25}Ga_{0.75}N$ and having a thickness of 200 Å is formed.

In the semiconductor laser device of this embodiment, it is possible to more sufficiently prevent carriers from leaking out of the MQW active layer 72 by the carrier leakage preventing layer. Consequently, the threshold current is further reduced as compared in the semiconductor laser device 100 shown in FIG. 1.

Although description was made of a case where the present invention is applied to the semiconductor laser device, the present invention may be applied to a semiconductor light emitting device other than the semiconductor laser device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nitride based semiconductor laser device comprising:

a light emitting layer composed of a Group III nitride based semiconductor and including an active layer; and a cladding layer of a first conduction type composed of a Group III nitride based semiconductor, formed on said light emitting layer, having a larger band gap than said active layer, and having a lower refractive index than the active layer, said cladding layer of a first conduction type having a ridge portion, and having a flat portion formed on both sides of the ridge portion, said cladding layer of a first conduction type having an aluminum composition ratio of not more than 0.05, the maximum thickness of said cladding layer of a first conduction type being less than 0.3 $\mu$m, and said flat portion having a thickness of 0.05 to 0.15 $\mu$m.

2. The nitride based semiconductor laser device according to claim 1, wherein said light emitting layer further includes an optical guide layer of a first conduction type formed on said active layer, said optical guide layer of a first conduction type has a smaller band gap and a higher refractive index than said cladding layer of a first conduction type and has a larger band gap and a lower refractive index than said active layer, and said cladding layer of a first conduction type is formed on said optical guide layer of a first conduction type.

3. The nitride based semiconductor laser device according to claim 2, wherein said light emitting layer further includes a carrier leakage preventing layer of a first conduction type formed on said active layer and having a larger band gap than said optical guide layer of a first conduction type, and said optical guide layer of a first conduction type is formed on said carrier leakage preventing layer of a first conduction type.

4. The nitride based semiconductor laser device according to claim 1, wherein said Group III nitride based semiconductor contain at least one of boron, gallium, aluminum, indium, and thallium.

5. The nitride based semiconductor laser device according to claim 1, wherein said cladding layer of a first conduction type contains gallium and aluminum.

6. The nitride based semiconductor laser device according to claim 1, wherein said active layer contains gallium and indium.

7. The nitride based semiconductor laser device according to claim 1, wherein said active layer has a multi-quantum well structure alternately including one or more well layers and a plurality of quantum barrier layers, and the band gap of the active layer is the band gap of said one or more well layers.

8. The nitride based semiconductor laser device according to claim 1, wherein an electric field distribution of laser light in the active layer is changed in accordance with a sine function or a cosine function, and an electric field distribution of laser light in the cladding layer of a first conduction type is changed in accordance with an exponential function.

9. The nitride based semiconductor laser device according to claim 1, further comprising a current blocking layer formed on or in said cladding layer of a first conduction type and having a striped opening.

10. The nitride based semiconductor laser device according to claim 1, wherein said first conduction type is a p type.

11. The nitride based semiconductor laser device according to claim 1, further comprising a cladding layer of a second conduction type composed of a Group III nitride based semiconductor, wherein said light emitting layer is formed on said cladding layer of a second conduction type.

* * * * *